United States Patent [19]

Wichmann

[11] 4,004,238
[45] Jan. 18, 1977

[54] METHOD AND APPARATUS FOR THE REMOVAL OF RINGING PHENOMENA FROM SIGNAL IMPULSES

[75] Inventor: Günter Wichmann, Leimen, Germany

[73] Assignee: Eltro GmbH Gesellschaft fur Strahlungstechnik, Heidelberg, Germany

[22] Filed: Oct. 31, 1975

[21] Appl. No.: 627,917

[30] Foreign Application Priority Data

Dec. 14, 1974 Germany .................. 2459242

[52] U.S. Cl. .................. 328/165; 333/70 A
[51] Int. Cl.² .................. H03B 1/04
[58] Field of Search ......... 328/165, 166; 333/70 A; 325/378

[56] References Cited

UNITED STATES PATENTS

| | | | |
|---|---|---|---|
| 3,403,345 | 9/1968 | Frank et al. ........ | 333/70 A |
| 3,546,589 | 12/1970 | Gingell ........ | 333/70 A |
| 3,795,877 | 3/1974 | Poole ........ | 328/165 X |

Primary Examiner—John S. Heyman

[57] ABSTRACT

A method is contemplated for removing ringing phenomena from a signal impulse which comprises storing amounts of energy or voltage corresponding to amplitude variations of the signal impulse, interrogating said amounts in a delayed manner, and subsequently feeding back the interrogated amounts to the signal impulse. An apparatus is provided for the method which comprises an analog memory including a ring stepping switch including switching contacts, storage capacitors coupled to said contacts and means for interrogating said capacitors. The number of switching steps is determined by the number of the switching contacts and corresponds at least in part to part of the signal impulse passing unchanged through the apparatus. The apparatus further comprises a plurality of storage means for storing respective indicia of magnitudes of sequential sections, impulse interrogating means for sequentially interrogating the storage means with a fixed delay, and means to couple the interrogating means to the storage means in feedback relation.

9 Claims, 13 Drawing Figures

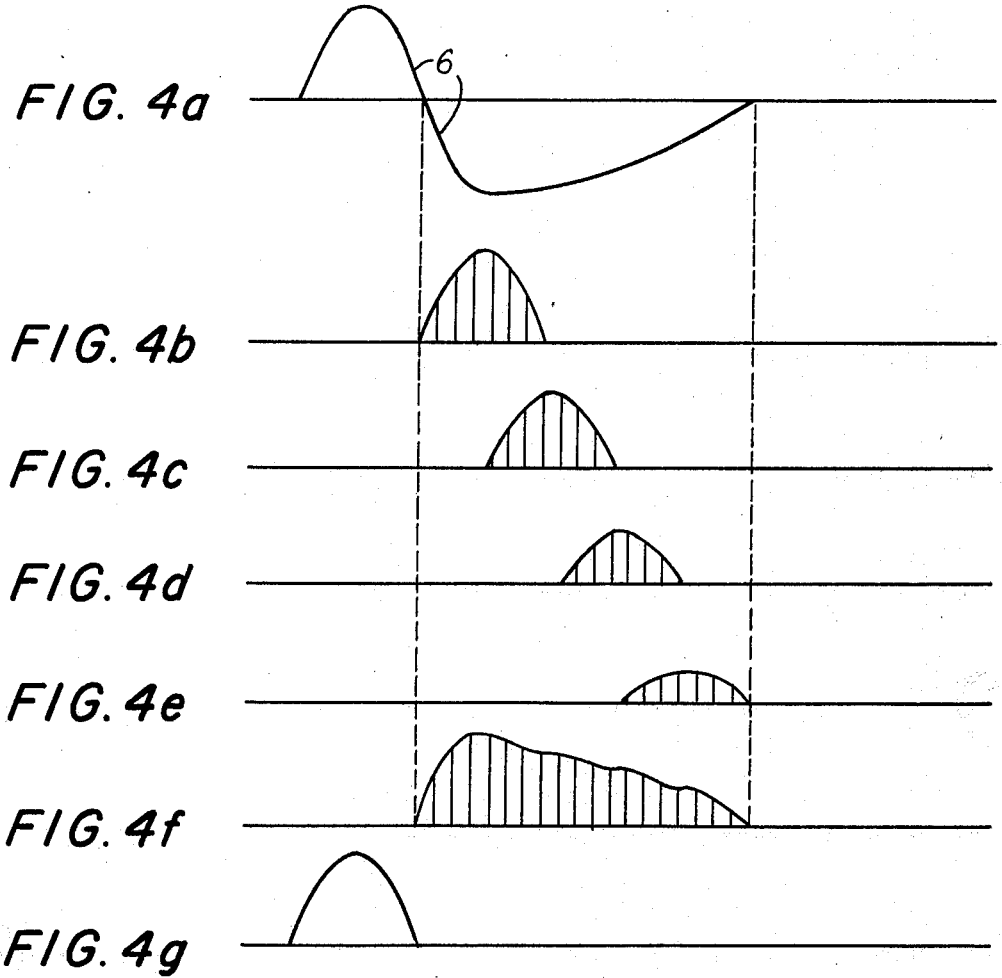

4,004,238

METHOD AND APPARATUS FOR THE REMOVAL OF RINGING PHENOMENA FROM SIGNAL IMPULSES

FIELD OF THE INVENTION

The invention relates to methods and apparatus for the removal of ringing phenomena from signal impulses.

BACKGROUND OF THE INVENTION

It is known to remove ringing phenomena which may occur on transmission paths from signal impulses by means of filters. This can be realized relatively easily by means of conventional filters if the frequency components of the ringing phenomena are clearly distinguishable from those of the impulses.

If the impulse to be transmitted has, however, the form of a sinusoidal half-wave, for example, and if a ringing process or phenomenon occurs on the transmission path which, for example, represents a sinusoidal half-wave of equal frequency, then the removal of that ringing process by means of conventional filters is rather difficult. The impulse then has to be separated into its individual frequency components, and each individual component has to be corrected for amplitude and phase. This is extremely expensive, particularly for complicated ringing processes.

SUMMARY OF THE INVENTION

An object of the invention is to improve the removal of ringing processes or phenomena occurring due to impulses.

Another object of the invention is to develop a potentiality to suppress optimally every conceivable kind of ringing phenomena or process.

The above objects are achieved, according to the invention, while avoiding the above-mentioned disadvantages, by storing an amount of energy or voltage corresponding to the amplitude variation of the signal impulses in an active filter, which is interrogated upon request with a delay, and subsequently added to the signal impulse.

A particularly advantageous implementation of the invention provides for the amount of energy or value of voltage to be stored in an analog memory.

It is also advantageous if the analog memory consists of a mechanical or electrical circular stepping switch, whose switching contacts are provided with respective storage capacitors, whereby the totalled number of steps determined by the number of switching contacts corresponds at least to that part of the signal impulse which passes the filter unchanged.

Further features of the invention include the provision of at least one further range with the same number of switching steps for the delayed interrogation, the switching contacts of which are functionally connected with those of the analog memory, and the sliding contact of which is designed to be ahead of the sliding contact of the analog memory.

A still further advantageous development of the invention provides for the output of the active filter to be fed or coupled back to the input region of the active filter for the purpose of the summed input of signal impulses interrogated in a delayed manner having a second half wave of equal or smaller amplitude — i.e. to be fed back by means of an amplitude regulator — the output having an equal or inverted polarity of the half wave — i.e. if required or on demand by means of a phase inverter stage, whereby the feedback is accomplished by a harmonic filter coupled to the amplitude regulator.

If a plurality of interrogation ranges is used, a summing stage is interconnected between the amplitude regulator and the harmonic filter.

BRIEF DESCRIPTION OF THE DRAWING

Two embodiments of the invention are described below with reference to the accompanying drawing, wherein corresponding parts in the respective figures have the same reference numerals and wherein:

FIG. 4a shows a signal input of a more complicated nature occurring at the input of the active filter of FIG. 3;

FIG. 4b in conjunction with FIG. 4e shows the positive partial curves corresponding to the individual interrogation ranges of FIG. 3 into which the negative portion of the signal impulse of FIG. 4a has been split up;

FIG. 4f shows the envelope of the partial curves illustrated in FIG. 4b to 4e or, in other words, the form of the signal impulse provided for the feedback;

FIG. 4g shows the final form of the signal impulse with the ringing having been removed.

DETAILED DESCRIPTION

Figure 1:
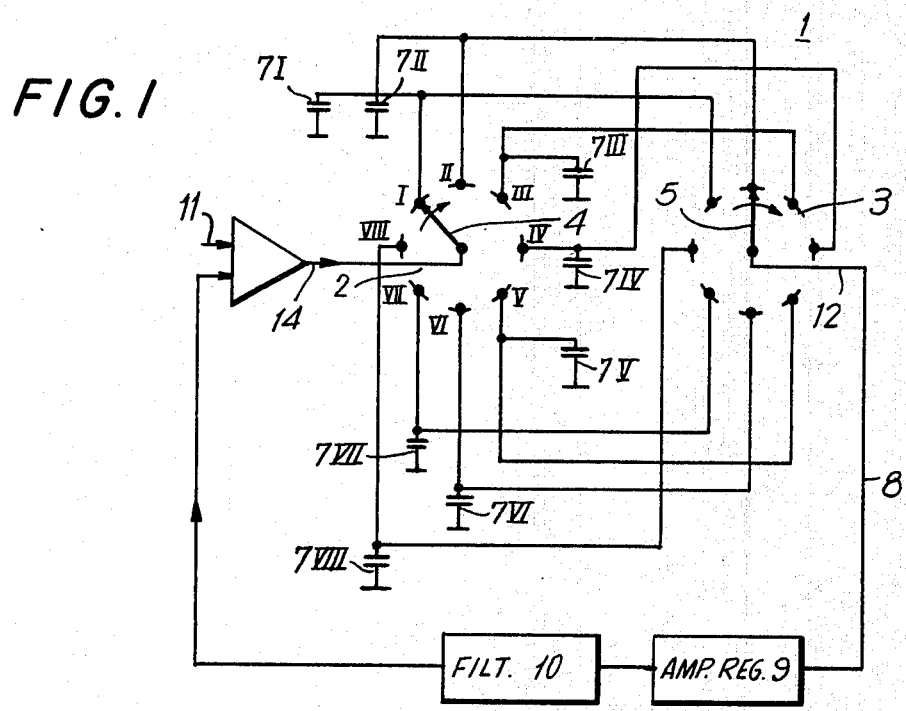
FIG. 1 is a partially block, partially schematic diagram of an active filter substantially consisting of an analog memory and an interrogation switch electrically connected therewith.

In FIG. 1, there is shown an active filter 1, which in its simplest form is substantially comprised of two ring stepping switches 2 and 3 coupled to one another. Ring stepping switch 2 corresponds to an analog memory, and ring stepping switch 3 corresponds to an interrogation switch. In the aforesaid implementation, both ring stepping switches are provided with eight respective switching contacts I to VIII, which are traversed in seven switching steps by respective sliding contacts 4 and 5 in a clockwise direction as shown by the arrow.

To illustrate the principle of operation, the simplest case will be taken first. This is the case in which there occurs on the input 11 of the active filter 1 the sinusoidal signal impulse 6 shown in FIG. 2a, the positive and negative halfwaves thereof differing merely in amplitude. Since the sliding contact of the circular stepping switch is in fixed relation to the time-variation of the input of the signal impulse 6, and since there is further connected with each of the switching contacts I to VIII a respective capacitor 7 connected to ground, upon the first rotation of the sliding contact 4, the positive half-wave of the signal impulse 6 is first stored in a subdivision $6^I$ to $6^{VII}$ corresponding to the seven switching steps and visible in FIG. 2a. In other words, this means that the capacitor $7^I$ is charged to a voltage corresponding to the strip $6^I$, the capacitor $7^{II}$ is charged to a voltage corresponding to the strip $6''$ and so forth up to the capacitor $7^{VII}$, which is charged to a voltage corresponding to the strip $6^{VII}$.

Figures 2A, 2B, 2C:
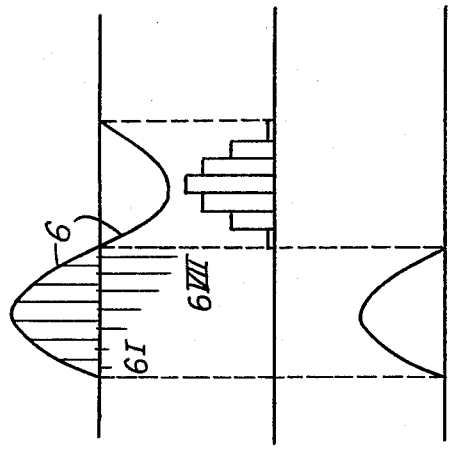
FIG. 2a shows the simplest form of a signal impulse occurring at the input of the active filter according to FIG. 1.
FIG. 2b shows the form of the signal impulse provided for the feedback.
FIG. 2c shows the final form of the signal impulse upon removal of the ringing.
Figure 5:
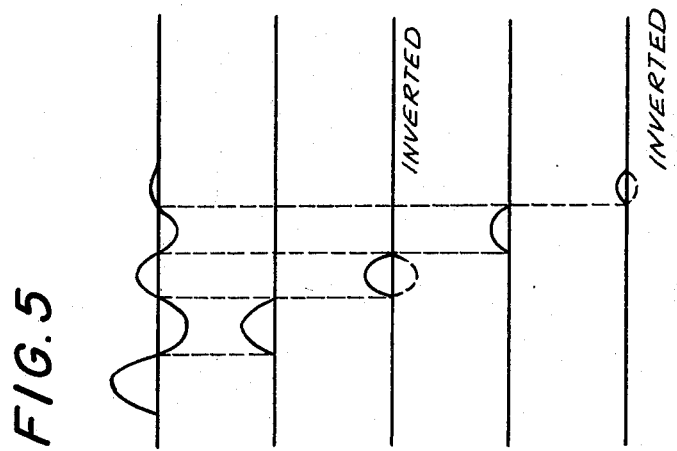
FIG. 5 shows a signal impulse with inverted polarity.

Since the initial position of the sliding contact 5 is displaced with respect to that of the sliding contact 4 by a switching step in a clockwise direction, the sliding contact 5 starting simultaneously with the sliding contact 4, but advanced with respect thereto, will interrogate during the first rotation only switching contacts not having any charge. As soon as the pointer or sliding contact 4 arrives on the switching contact VIII, the sliding contact 5, which is advanced with respect to the sliding contact 4 and at this time dwells on the switching contact I, will find a charge for the first time there as well as on the following switching contacts II to VIII. A delayed interrogation of the data stored by means of the ring stepping switch 2 is therefore possible via the ring stepping switch 3. The internal resistance of the signal impulse 6 or source thereof is here so low that, during the dwell time of the sliding contact 5, the storage capacitor can be completely recharged. Delay can be so chosen that the interrogated values fall, as shown in FIG. 2b, within the time region of the negative half-wave of FIG. 2b. If the amplitude of the second negative half-wave is equal to or smaller than the first, positive half-wave of the signal impulse 6, then the output 12 of the active filter 1 can be fed back from the interrogation output via the electrical connection 8 of an amplitude regulator 9 and a harmonic filter 10 coupled thereto according to FIG. 2b, so that the signal impulses interrogated with a delay are now fed into the unit with a regulated amplitude by means of the regulator 9. It is the function of the harmonic filter 10 to filter out the harmonics generated by the interrogation process. The final shape of the signal impulse upon the removal of ringing, or having only one half-wave — the second half-wave having been suppressed — is shown in FIG. 2c. This impulse is at the region of the arrow 14 in FIG. 1.

Figure 3:
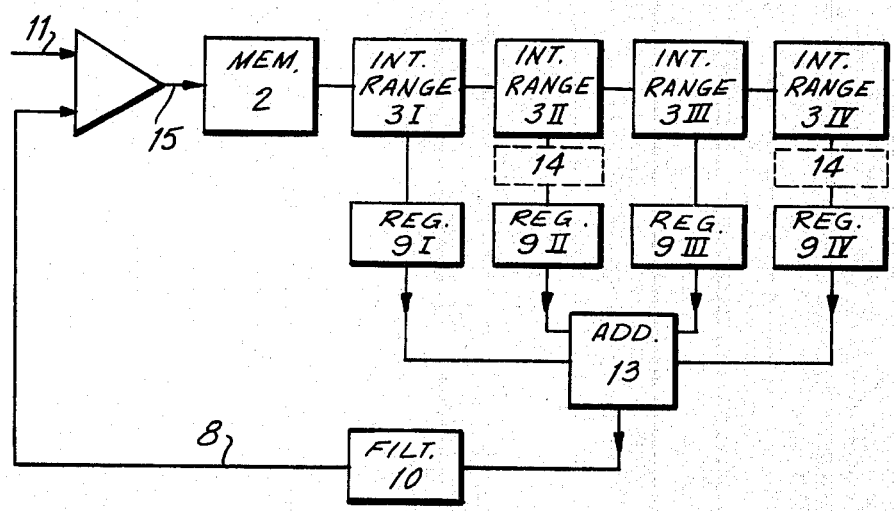
FIG. 3 is a block diagram corresponding with FIG. 1, but with a plurality of ranges.

In FIG. 3, there occurs on the input 11 a more complicated signal impulse 6, the positive and negative half-waves thereof differing in amplitude and shape as shown in FIG. 4a. Here also the complicated form or shape must be constructed from the first half-wave (FIG. 4f). A more accurate subdivision is accomplished by a plurality of switching processes per half-wave, and concurrently by a larger number of interrogation ranges $3^I$ to $3^{IV}$, which leads to the positive envelope ascertainable from FIG. 4f via the connecting summation in the addition stage 13. That envelope is the sum of the positive partial curves shown in FIGS. 4b to 4e, corresponding to the individual ranges $3^I$ to $3^{IV}$, into which the negative half-wave of FIG. 4a was split up. This sum is fed to the adder 13 via the regulators $9^I$ to $9^{IV}$ (FIG. 3) regulated in respective amplitudes thereof. The final shape of the signal impulse having again only a half wave—the second half wave was suppressed here also — is represented in FIG. 4g. This impulse is in the region of arrow 15 (FIG. 3).

Concerning the start of rotation of the ring stepping switch, the switching contact I of, for example, the ring stepping switch 3, can coincide with the start of the first half-wave or — still viewed in relation to time — be ahead thereof. It is also possible to select the number of switching contacts to be lower or considerably higher than shown in the aforesaid examples. In the latter case paritcularly, it can happen that only a part of the switching contacts of a ring counter is required for the storage of interrogation of a signal impulse.

The aforesaid method can only be employed if the ringing processes to be quenched are equal or smaller in amplitude than the amplitude of the part of the impulse to be transmitted, since the feedback can never exceed 1. If the amplitude of the ringing process is, however, larger, then the correction must take place in several steps. This can be illustrated by means of the following numerical example.

Assuming that the amplitude of the ringing process is 1.5 times as large as that of the impulse itself, the first filter could reduce the ringing process to an amplitude of 0.5, i.e. by means of a feedback factor of 1, and a second, postcoupled filter could quench the ringing completely by a feedback factor of 0.5. One must take into account the fact that, if the ringing is not completely quenched, a new secondary ringing occurs at the output of the filter, so that the second filter requires a further interrogation range.

What is claimed is:

1. A method for the removal of ringing phenomena from a signal impulse in a wide-band spectrum, said method comprising storing amounts of energy or voltage corresponding to amplitude variations of the signal impulse, interrogating said amounts in a delayed manner, and subsequently feeding back the interrogated amounts to the signal impulse for regenerating said signal impulse after having become deformed by decaying transients.

2. A method according to claim 1, comprising storing said amounts in an analog memory.

3. An apparatus for the removal of ringing phenomena from a signal impulse in a wide-band spectrum, said apparatus comprising an analog memory including a ring stepping switch including switching contacts, storage capacitors coupled to said contacts and means for interrogating said capacitors, the number of switching steps being determined by the number of said switching contacts and corresponding at least in part to part of the signal impulse passing unchanged through said apparatus for regenerating said signal impulse after having become deformed by decaying transients.

4. An apparatus according to claim 3 wherein said means includes delayed interrogation means including switching contacts connected with those of the analog memory said analog contact and said means respectively including sliding contacts for engaging the switching contacts, the sliding contact of said means being advanced ahead of the sliding contact of the analog memory, said switching contacts being rotatably staggered in the same sense for varying delays and signal amplitudes.

5. An apparatus according to claim 4 comprising feedback means by which the output of said interrogation means is fed back as an input to said analog memory.

6. An apparatus according to claim 5 wherein said feedback means includes a harmonic filter and an amplitude regulator connected in series.

7. An apparatus according to claim 5 comprising an adding stage interconnected between the amplitude regulator and the harmonic filter.

8. Apparatus for removing ringing phenomena from an impulse in a wide-band spectrum, said apparatus comprising a plurality of storage means for storing respective indicia of magnitudes of sequential sections of said impulse, interrogating means for sequentially interrogating said storage means with a fixed delay, and means to couple said interrogating means to said storage means in feedback relation for regenerating said impulse after having become deformed by decaying transients.

9. Apparatus as claimed in claim 8 wherein said storage means are analog storage means.

* * * * *